United States Patent [19]

Kowal

[11] 4,366,451

[45] Dec. 28, 1982

[54] CHROMINANCE SUBCARRIER REGENERATION NETWORK

[76] Inventor: Leonard Kowal, 12647 Miller Ave., Saratoga, Calif. 95070

[21] Appl. No.: 320,524

[22] Filed: Nov. 12, 1981

Related U.S. Application Data

[63] Continuation of Ser. No. 86,448, Oct. 19, 1979, abandoned.

[51] Int. Cl.³ .............................................. H03L 7/08
[52] U.S. Cl. ........................................ 331/20; 331/25; 331/30; 455/259; 455/260; 455/264; 358/25
[58] Field of Search ................. 331/1 R, 1 A, 18, 20, 331/25, 30; 455/208, 257–260, 263–265; 358/19, 25

[56] References Cited

U.S. PATENT DOCUMENTS

| | | | |
|---|---|---|---|
| 3,619,803 | 11/1971 | Klein | 331/20 X |
| 3,909,723 | 9/1975 | Manson et al. | 455/259 X |
| 4,118,741 | 10/1978 | Gomi et al. | 358/25 X |

Primary Examiner—Siegfried H. Grimm
Assistant Examiner—Edward P. Westin
Attorney, Agent, or Firm—Thomas E. Schatzel

[57] ABSTRACT

A chrominance subcarrier regeneration network having high stability, the network being adapted for use in a video tape recorder and including a phase detector for comparing the phase of a gated subcarrier burst of a video signal with that of a subcarrier regenerated signal to develop an error signal; a voltage controlled oscillator driven by the error signal to develop a corrected signal at a frequency substantially below that of the subcarrier burst; and a crystal oscillator, mixer and filter for translating the frequency and filtering the corrected signal to develop the regenerated signal.

7 Claims, 4 Drawing Figures

Fig_1

CHROMINANCE SUBCARRIER REGENERATION NETWORK

This is a continuation of application Ser. No. 086,448, filed Oct. 19, 1979 and now abandoned.

BACKGROUND OF THE INVENTION

1. Field of the Invention

The present invention relates generally to videotape recorders and more specifically to a high stability chrominance subcarrier regeneration network employing a reduced frequency voltage controlled oscillator circuit, the output of which is translated to the subcarrier frequency by a higher frequency crystal oscillator.

2. Description of the Prior Art

Color television systems such as those which conform to the NTSC (National Television System Committee) standard used in the United States process luminence (black and white) and chrominance (color) information separately. The chrominance information, which takes the form of a pair of difference signals commonly referred to as I and Q, is used to modulate a pair of 180° displaced signals developed from a chrominance subcarrier signal. The pair of 180° displaced signals are used to develop suppressed carrier modulated chrominance signals that are combined with the luminence information within the luminence band width to provide a means of demodulating the modulated signals. Also, a burst is included following each horizontal synchronization pulse. From the subcarrier burst signal the chrominance subcarrier signal can be regenerated to provide a reference for use in demodulating the suppressed carrier modulated chrominance signals and thus recover the chrominance information.

It is a relatively simple matter to regenerate the chrominance subcarrier signal from broadcast quality signals in that it is required that the subcarrier be maintained within ±10 Hertz of the center frequency of 3.579545 megahertz. Typically, the phase of each of the subcarrier burst signals is compared in a phase detector with the output of a voltage controlled crystal oscillator operating generally at the subcarrier frequency. The phase detector develops an error signal which is used to voltage control the frequency of the oscillator thereby locking it in frequency and phase to that of the subcarrier burst signals. When so phase locked, the voltage controlled crystal oscillator generates the required regenerated subcarrier signal at its output.

A more difficult regeneration problem is presented by video signals which have been tape recorded and reproduced. This is due to the degradation that results from large time perturbations that are introduced by the recordation/reproduction process which causes similar perturbations in the modulated chrominance signals.

A number of methods are known in the art for compensating for the time perturbations introduced by the recordation/reproduction process. One such method called the "color under" method employs circuitry which translates the frequency of the modulated chrominance signals to a substantially lower frequency such as 688 kilohertz before they are recorded. At this lower frequency, the signals are less susceptible to time base error degradation. The signals are then retranslated back to approximately 3.58 megahertz after they are reproduced.

In some prior art type recorder/reproducers, the modulated chrominance signals are further stabilized during this later retranslation process. Typically, these recorder/reproducers employ a mixer driven by a 4.27 megahertz correcting signal for correcting while retranslating the reproduced chrominance signals from 688 kilohertz to 3.58 megahertz. The correcting signal is derived from the retranslated reproduced chrominance signals by a gate which extracts the subcarrier burst signals therefrom, a phase comparator which compares the phase of a subcarrier burst with that of a 3.58 megahertz signal generated by a crystal oscillator to develop an error signal which is used to drive a 688 kilohertz voltage control control oscillator, and another mixer for combining the output of the 688 kilohertz oscillator with that of the 3.58 megahertz crystal oscillator to develop the correcting signal.

It is important to note that the above-described circuit does not generate a regenerated subcarrier signal. The closest parallel thereto is a 4.27 megahertz correcting signal which is used both to correct and translate the reproduced chrominance signals.

A number of prior art methods exist for stabilizing reproduced modulated chrominance signals which have been directly recorded and reproduced without frequency translation. One method called the demodulation-remodulation method employs circuitry for developing a regenerated subcarrier signal from the reproduced modulated chrominance signal. As the name implies, the regenerated subcarrier is used to demodulate the reproduced modulated chrominance signals which are remodulated using a stable chrominance subcarrier signal.

Another method called the time base correcting method again relies on circuitry for developing a regenerated subcarrier signal. In general, the regenerated subcarrier signal and a horizontal synchronization signal also developed from the reproduced signals are used to clock the reproduced signals into a semiconductor memory from which they are extracted at a more constant rate in response to a stable reference signal.

Finally, a heterdyne method may be used to stabilize the reproduced modulated chrominance signals. Typically, two product signals are generated from a 3.58 megahertz reference signal. One of the product signals at 3.5 times the reference frequency is combined in a mixer with a regenerated subcarrier signal to produce a first sum signal. The other product signal at 4.5 times the reference frequency is combined in a mixer with the reproduced modulated chrominance signals to develop other sum signals. Finally, another mixer is employed to combine the sum signals and to develop therefrom difference signals which are the stabilized reproduced modulated chrominance signals.

It should be noted that the above-described stabilizing methods require the use of a regenerated subcarrier signal which is intimately locked in frequency and phase to the reference burst of the degradated composite video signal. Unfortunately, a phase lock loop employing a crystal controlled voltage controlled oscillator will not suffice in that it has inadequate capture band width. In other words, without extreme measures, the frequency of a 3.58 megahertz crystal oscillator cannot be pushed or pulled the amount necessary to follow the perturbations introduced by the recordation/reproduction process.

One prior art solution employs a regular free running voltage controlled modulator (not crystal controlled). Although effective, unless extremely stable, the oscillator will not properly lock to the subcarrier burst signals of the reproduced signal. The oscillator will instead lock to the side bands thereof. This is because when the original subcarrier oscillator signal is gated to develop each of the subcarrier bursts following each horizontal synchronization pulse, the subcarrier oscillator signal is modulated by the horizontal frequency generating many side bands near the subcarrier frequency of approximately 3.58 megahertz but differing therefrom and from each other by the horizontal frequency of approximately 15.75 kilohertz. Thus, should the voltage controlled oscillator through aging, shock, or temperature effects, drift in excess of approximately ¼%, the subcarrier regeneration circuit may lock to one of the side bands. Heretofore, to prevent such an improper lock, it has been necessary to manually examine the resultant picture and to adjust the free running frequency of the voltage controlled oscillator until a proper lock is obtained, to employ a high degree of precise temperature compensation, or to resort to complex compound phase locked loops to insure proper lock, or similar means.

SUMMARY OF THE INVENTION

It is therefore an object of the present invention to provide a stable network for subcarrier regeneration. Another object of the present invention is to provide a subcarrier regeneration network which will reliably lock to a gated reference signal which has been degraded by twice base errors. Still another object of the present invention is to provide a subcarrier regeneration network which is inexpensive.

Briefly, the preferred embodiment of the present invention includes a gate for extracting each of the chrominance subcarrier bursts from an amplified reproduced video signal responsive to a series of gate pulses. The gate pulses are developed from the reproduced video signal by an amplifier, a clamping circuit, and a pair of one-shot multivibrators. The amplifier and clamping circuit are adapted for extracting the horizontal synchronization pulses from the reproduced video signal and the pair of one-shot multivibrators are adapted for developing one of the gate impulses at a predetermined period following each horizontal synchronization pulse. The regeneration circuit further includes a phase detector for comparing the phase of each of the subcarrier bursts with that of a regenerated chrominance subcarrier signal to develop an error signal, a voltage controlled oscillator driven by the error signal for developing a corrected signal having a frequency substantially less than that of the subcarrier signal, a crystal oscillator for developing a reference signal having a frequency which is offset from that of the subcarrier signal by the frequency of the low frequency signal, a mixer for combining the low frequency signal and the reference signal to develop the subcarrier signal, and an image signal, and a filter for passing only the subcarrier signal.

A material advantage of the present invention is its stability.

Another advantage of the present invention is its simplicity.

These and other objects and advantages of the present invention will no doubt become apparent to those skilled in the art after having read the following detailed description of the preferred embodiment which is illustrated in the several figures of the drawing.

IN THE DRAWING

DETAILED DESCRIPTION OF THE PREFERRED EMBODIMENT

Figure 1:
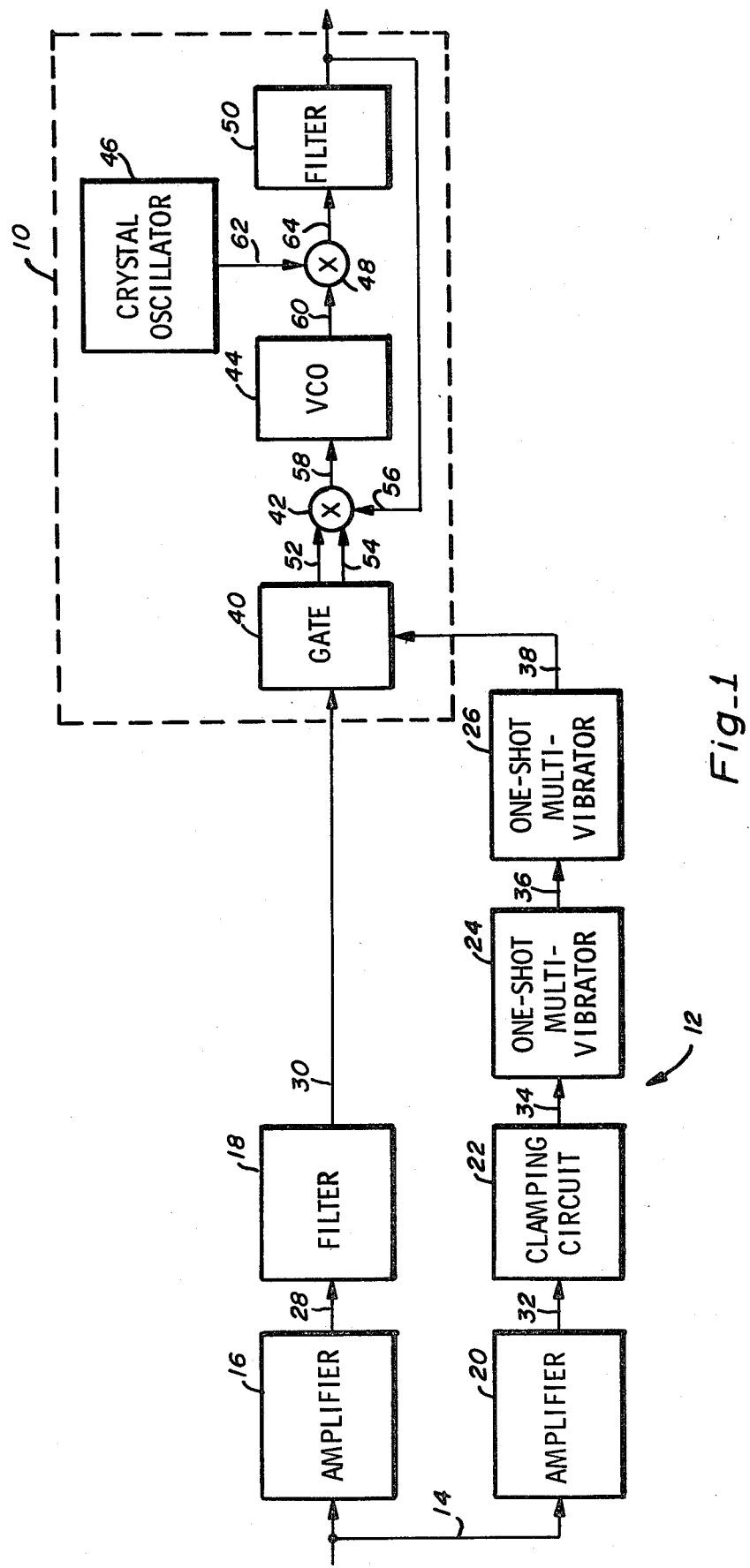
FIG. 1 is a block diagram of a chrominance subcarrier regeneration network for use in a video tape recorder in accordance with the present invention.

A chrominance subcarrier regenerating network in accordance with the present invention is illustrated in FIG. 1, and generally designated by the number 10. As an aid to the understanding of the present invention, a number of associated components are illustrated and generally designated by the number 12. The associated components 12 are adapted to derive those signals required by chrominance subcarrier regenerating network 10 from the color video signal developed on input line 14. The illustrated associated components include an amplifier 16, a filter 18, amplifier 20, a clamping circuit 22, and a pair of one-shot multivibrators 24 and 26.

Amplifier 16 has a single emitter follower stage operating as a buffer for coupling video signals developed on line 14 to a line 28. Coupling the chrominance portion of the video signals developed on line 28 to a line 30, filter 18 has a two-stage band pass filter tuned to 3.58 megahertz.

The video signals developed on line 14 are also amplified and buffered by amplifier 20 before being coupled to a line 32. Amplifier 20 has two stages, including a common emitter stage providing a small voltage gain followed by an emitter follower. Additionally, amplifier 20 has a resistance-capacitance (RC) network for attenuating higher frequency components of the video signals.

Clamping circuit 22 has a single, common emitter stage which is biased near cutoff and driven hard by the video signals developed on line 32 to develop on a line 34 a signal which represents the horizontal synchronization portion of the video signal.

Triggered by the trailing edge of each of the horizontal synchronization pulses developed on line 34, one-shot multivibrator 24 generates a narrow pulse on line 36 to provide a delay to synchronize the triggering of multivibrator 26 with the beginning of each of the subcarrier color bursts. One-shot multivibrator 26, which is triggered by the trailing edge of each pulse generated by one-shot multivibrator 24 on line 36, generates on a line 38 a pulse of width equal to and synchronized with each of the subcarrier bursts of the video signal.

Chrominance subcarrier regenerating circuit 10 is illustrated as including a gate 40, a phase detector 42, a voltage controlled oscillator (VCO) 44, a crystal oscillator 46, a mixer 48, and a band pass filter 50.

Gate 40 includes a device responsive to each of the pulses generated on line 38 and operative to couple each subcarrier burst from line 30 to phase detector 42. Since, in the preferred embodiment, gate 40 has a balanced output and mixer 42 has a balanced input, two similar out-of-phase subcarrier bursts are coupled to phase detector 42 by a pair of lines 52 and 54, respectively.

Phase detector 42 is a balanced detector having an input tuned to 3.58 megahertz for receiving each of the subcarrier bursts. Detector 42 compares the phase of each of the bursts with a regenerated subcarrier signal, which is developed on a line 56, and generates an error signal proportional to the instantaneous phase difference therebetween. The error signal is buffered by an operational amplifier which is incorporated in phase detector 42 before being coupled to a line 58 to prevent interaction between detector 42 and VCO 44.

VCO 44 is a varactor tuned oscillator of the Colpitts variety, employing a pair of transistors connected in a Darlington configuration, with an additional emitter follower stage for buffering. Oscillator 44 generates a signal on a line 60 having a frequency which is controlled by the error signal developed on line 58. In the preferred embodiment, oscillator 44 is configured to have a free-running frequency of approximately 580 kilohertz.

Crystal oscillator 46 is similar to oscillator 44 in that it employs a pair of transistors in a Darlington configuration as the active elements in a Colpitts type oscillator. In place of the varactor and the LC network of oscillator 44, oscillator 46 employs a crystal having a frequency, in the preferred embodiment, of three megahertz. The output of oscillator 46 is also buffered by an emitter follower included therein before being coupled to a line 62.

Mixer 48 employs a balanced device for combining the VCO signal on line 60 with the crystal oscillator signal on line 62 to generate on a line 64 sum and difference signals, with the sum signal being the regenerated subcarrier signal. A single pole band-pass filter in filter 50 passes essentially intact the sum signal while attenuating the difference signal. An emitter follower included in filter 50 buffers the sum signal to develop the subcarrier regenerated signal, which is coupled to line 56.

It should be understood that by employing a voltage controlled oscillator VCO such as oscillator 44, operating at a much lower frequency than the subcarrier frequency, provides a much more stable subcarrier regenerating circuit than is possible with a VCO operating at the subcarrier frequency. This is because, with present technology, the achievable stability of VCO's, as measured in percent, is relatively independent of their operating frequency. Additionally, when a lower frequency VCO is employed, such as at 1/6 the subcarrier frequency, the resultant drift when measured in percent at the subcarrier frequency is reduced by the same factor, in this case, the factor of six, from that measured at the VCO frequency.

Obviously, this suggests that if more stability is required, a lower VCO frequency should be employed. It should be noted, however, that as the VCO frequency is lowered, the image frequency approaches the sum frequency, increasing the filtering requirements of filter 50. At some point, it is more economical to replace mixer 48 and filter 50 with a pair of mixers operating as single side band suppressed carrier mixer to generate only the sum frequency.

Further, if desired, crystal oscillator 46 may be operated at a frequency which exceeds the subcarrier frequency by the VCO frequency if an additional 180° phase shift is introduced, within the phase locked loop. Such a shift may be obtained, for example, by an invertor or by using the other input of the operational amplifier in phase detector 42 to amplify the error signal.

Figure 2:
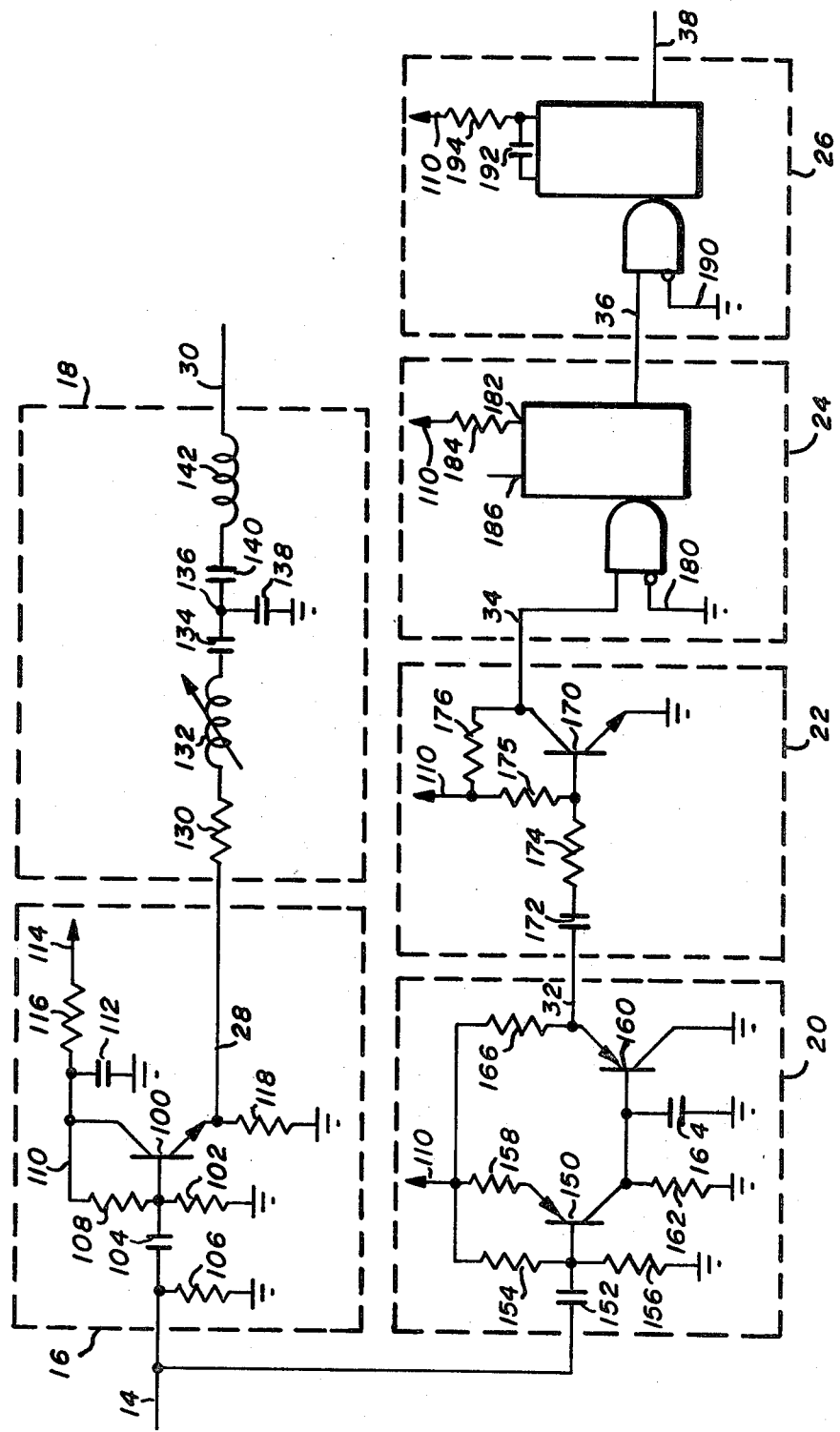
FIG. 2 is a schematic diagram further illustrating the amplifiers, filter, clamping circuit and one-shot multivibrators shown in FIG. 1.

Turning now to FIG. 2, amplifier 16 is shown to include an NPN transistor 100 having a base which is connected to circuit ground by a biasing resistor 102, by a DC blocking capacitor 104 to line 14, which line 14 is connected to circuit ground by a line terminating resistor 106 and by another biasing resistor 108 to a line 110. Line 110, which is decoupled by a capacitor 112 therefrom to circuit ground is coupled to a power supply potential developed on a line 114 by a decoupling resistor 116. Additionally, transistor 100 has an emitter connected to line 28 which is coupled to circuit ground by an emitter biasing resistor 118 and a collector which is connected to line 110. Filter 18 is shown to include a source impedance setting resistor 130, a variable inductor 132, and a filter capacitor 134, all of which being connected in series between line 28 and a node 136, which is coupled to circuit ground by a coupling capacitor 138. Series connected between node 136 and line 30 is a filter capacitor 140 and a filter inductor 142.

Amplifier 20 includes a PNP transistor 150 having a base coupled by a DC blocking capacitor 152 to line 14, by a biasing resistor 154 to the potential developed on line 110, and by another biasing resistor 156 to circuit ground. Transistor 150 also has an emitter coupled to line 110 by a biasing and degeneration resistor 158 and a collector connected to the base of a transistor 160. The collector of transistor 150 is also coupled to circuit ground both by a collector load resistor 162 and a filter capacitor 164. Additionally, transistor 160 has a collector connected to circuit ground and an emitter connected to line 32 which is coupled to the power supply potential developed on line 110 by an emitter resistor 166.

Clamping circuit 22 includes an NPN transistor 170 having an emitter connected to circuit ground, a base coupled by the series connection of a DC blocking capacitor 172 and a coupling resistor 174 to line 32 and to line 110 by a biasing resistor 175, and a collector connected to line 34 which is coupled to line 110 by a collector load resistor 176. In the preferred embodiment, resistor 175 is selected to have a high resistance, typically 1 megohm, so as to bias transistor 170 near cutoff.

In the preferred embodiment, one-shot multivibrators 24 and 26 are each portions of the same device, e.g. a one-shot multivibrator device designated in the industry as 74C221. The portion employed for one-shot multivibrator 24 includes a rising edge triggered input connected to line 34, another input connected by a line 180 to circuit ground, a first time constant input 182, which is coupled to the power supply potential developed on line 110 by a time constant resistor 184, a second time constant input 186 which is unused, and an output connected to line 36. In the preferred embodiment, no time constant capacitor is connected between inputs 182 and 186. Rather, the internal capacitance of the device is relied upon. The portion of the device employed for one-shot multivibrator 26 also includes a rising edge triggered input which is connected to line 36, another input connected to circuit ground by a line 190, a first time constant input coupled by a time constant capacitor 192 to a second time constant input that is coupled by a time constant capacitor 194 to line 110 and an output connected to line 38.

Figure 3:
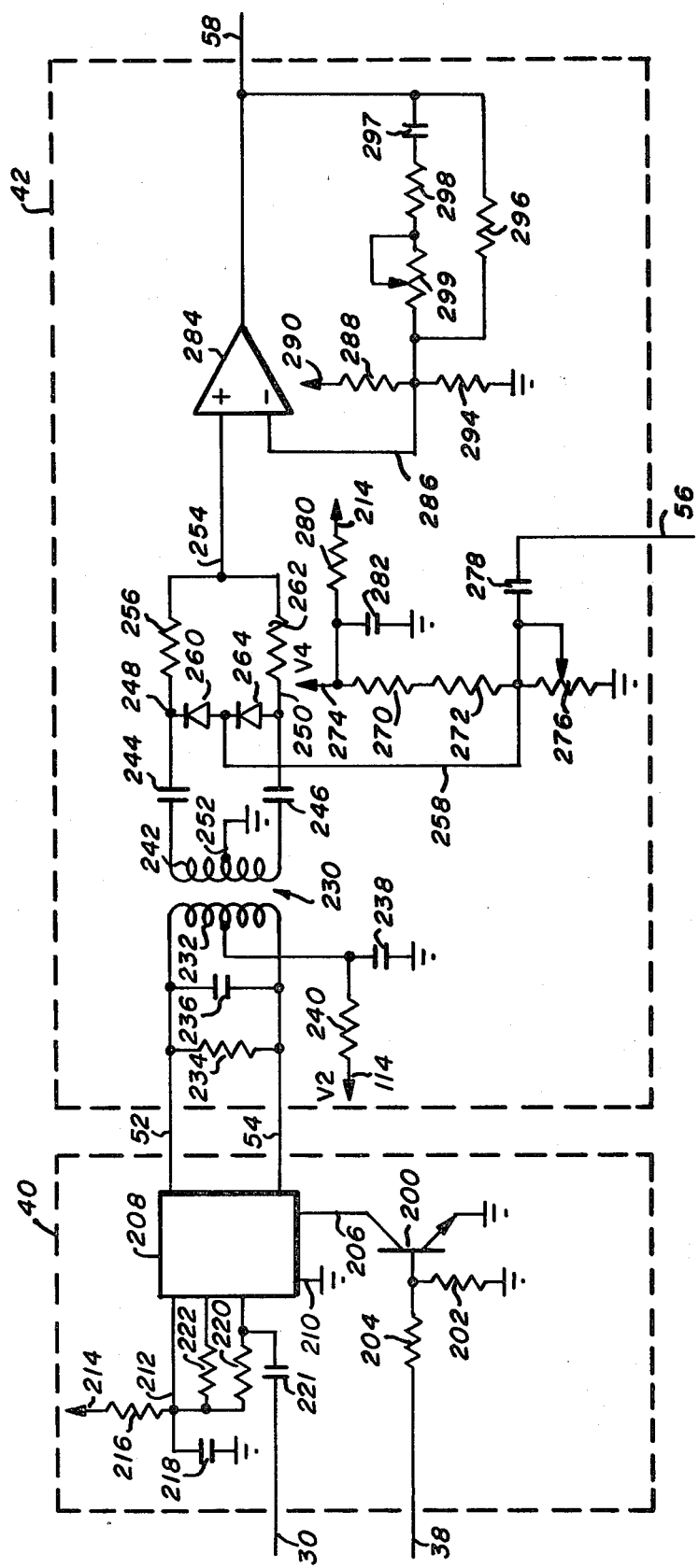
FIG. 3 is a schematic diagram further illustrating the gate and the phase detector of the chrominance subcarrier regenerating network shown in FIG. 1.

Gate 40 is shown in FIG. 3 to include an NPN transistor 200 having a base coupled to circuit ground by a pulldown resistor 202 and to line 38 by a base current limiting resistor 204. Transistor 200 also has an emitter connected to circuit ground and a collector connected by a line 206 to an input of an amplifier 208. Preferably, amplifier 208 employs a device such as that which is a designated CA3028 by Radio Corporation of America. Amplifier 208 includes a differential amplifier, the emitters of which are driven by a constant current generator transistor. The constant current generator transistor in amplifier 208 has an emitter which is coupled by an emitter biasing resistor and a line 210 to circuit ground, a base connected to line 206 for turning off the constant current generator and a biasing network connected to a line 212 for receiving a power supply potential developed thereon. Line 212 is coupled to a line 214 by a decoupling resistor 216 and to circuit ground by a decoupling capacitor 218. A more highly regulated power supply potential is developed on line 214 from the potential developed on line 114 (see FIG. 2).

The base of one of the differential amplifier transistors in amplifier 208 is coupled to line 212 by a biasing resistor 220 and to line 30 by a DC blocking capacitor 221. The other differential amplifier transistor in amplifier 208 has a base coupled to line 212 by another biasing resistor 222. The collectors of the differential amplifier transistors in amplifier 208 are connected respectively to lines 152 and 154.

Phase detector 42 includes a transformer 230 having a primary winding 232 which is connected between lines 152 and 154. Also connected between lines 152 and 154 is a damping resistor 234 and a resonating capacitor 236. Winding 232 has a center tap connection coupled to circuit ground by a decoupling capacitor 238 and to the power supply potential developed on line 114 by a decoupling resistor 240. Transformer 230 additionally has a secondary winding 242, the distal ends of which are coupled by a pair of DC blocking capacitors 244 and 246 to a pair of lines 248 and 250, respectively. A center tap of winding 242 is connected by a line 252 to circuit ground.

Line 248 is coupled to a line 254 by a summing resistor 256 and to a line 258 by a detector diode 260. Line 250 is similarly coupled to line 254 by a summing resistor 262 and to line 258 by a detector diode 264. A biasing potential is developed on line 258 by the series connection of a biasing resistor 270 and a biasing resistor 272 connected between a line 274 and line 258 and a biasing potentiometer 276 connected between line 258 and circuit ground. Line 258 is coupled by a DC blocking capacitor 278 to line 56. A decoupling resistor 280 couples power from line 214 to line 274 which is bypassed to circuit ground by a decoupling capacitor 282.

Phase detector 42 further includes an operational amplifier 284 having a non-inverting input connected to line 254 and an inverting input connected to a line 286 and an output connected to line 58. A bias potential is developed on line 286 by a first biasing resistor 288 connected between a power supply line 290 and line 286, and a second biasing resistor 294 connected between line 286 and circuit ground. The gain of operational amplifier 284 is controlled by a feedback resistor 296 connected between line 58 and line 286 and a network comprised of a series combination of a capacitor 297, a resistor 298, and a potentiometer 299 connected between line 58 and line 286. Besides stabilizing amplifier 284, this later network sets the bandwidth of the whole phase locked loop.

Figure 4:
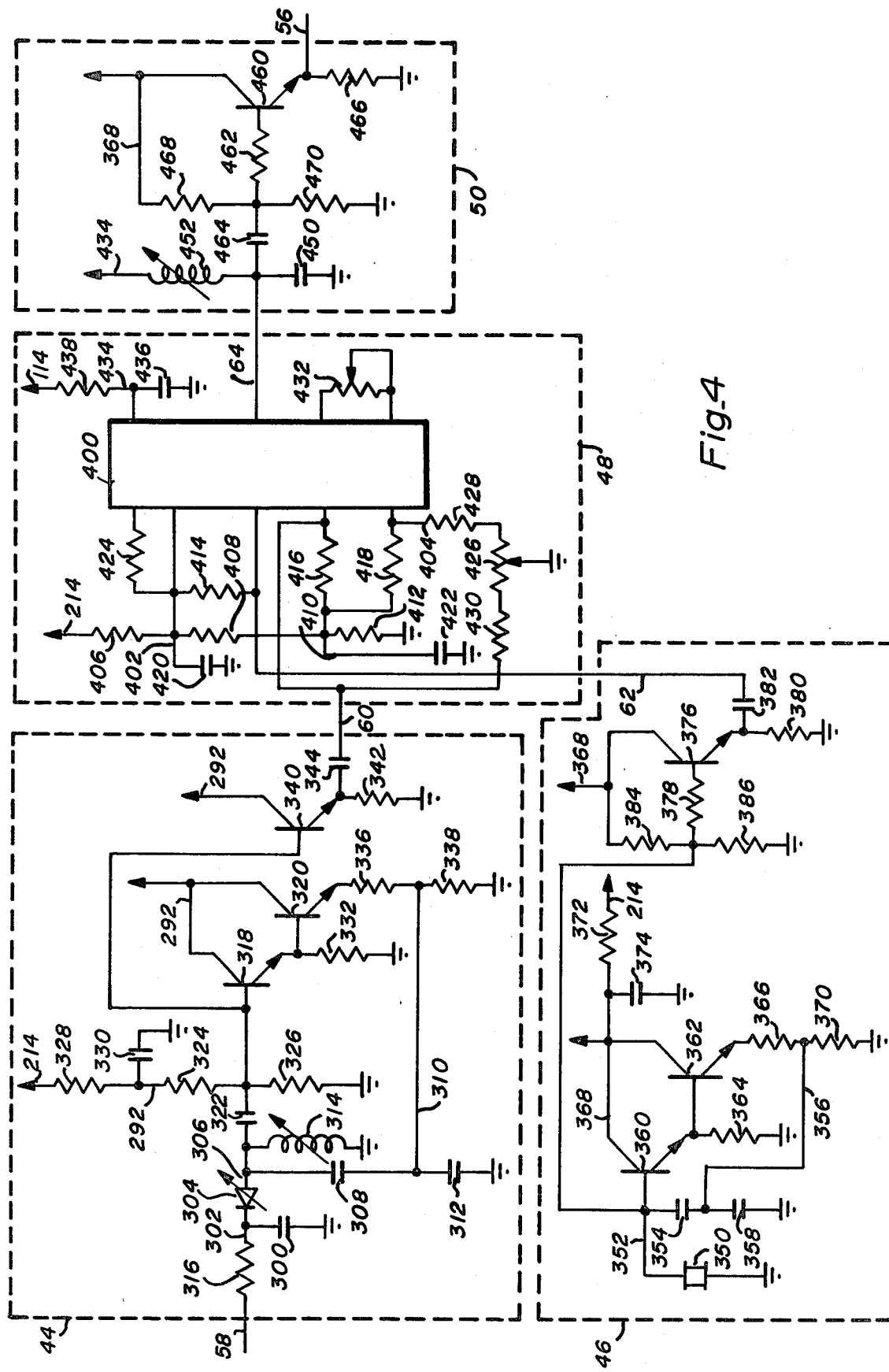
FIG. 4 is a schematic diagram further illustrating the voltage controlled oscillator, the mixer, the crystal oscillator, and the filter of the chrominance subcarrier regenerating network shown in FIG. 1.

Voltage controlled oscillator 44 is shown in FIG. 4 to include a tank circuit having a capacitor 300 connected between a line 302 and circuit ground, a varactor diode 304 connected between line 302 and a line 306, a capacitor 308 connected between line 306 and a line 310, a capacitor 312 connected between line 310 and circuit ground and a variable inductor 314 connected between line 306 and circuit ground. Line 302 is coupled to line 58 by a buffering resistor 316.

Driving the tank circuit is a pair of NPN transistors 318 and 320 which are connected in a Darlington configuration. The base of transistor 318 is coupled to line 306 by a DC blocking capacitor 322 and is biased by a potential developed at the juncture of a pair of biasing resistors 324 and 326 which are connected between power supply line 292 and circuit ground. A decoupling resistor 328 couples power from line 214 to line 292 which is coupled to circuit ground by a decoupling capacitor 330. The emitter of transistor 318 is coupled to circuit ground by a pulldown resistor 332, and the collector of transistor 318 with that of transistor 320 are connected to line 292. A emitter resistor 336 couples the emitter of transistor 320 to line 310 which is coupled to circuit ground by a biasing resistor 338.

Before being coupled to line 60, the output of the Colpitts oscillator is buffered by an emitter follower including as an active component in the form of an NPN transistor 340. Transistor 340 has a base connected to the base of transistor 318, a collector connected to line 292, and an emitter coupled to circuit ground by an emitter resistor 342 and to line 60 by a DC blocking capacitor 344.

Crystal oscillator 46 differs from VCO 44 primarily with respect to the tank circuit, the latter including as elements a three megahertz crystal 350 connected between a line 352 and circuit ground, a capacitor 354 connected between line 352 and and a line 356, and a capacitor 358 connected between line 356 and circuit ground. Crystal oscillator 46 includes a pair of transistors 360 and 362 connected in a Darlington configuration. The base of transistor 360 is connected to line 352, the emitter of transistor 360 is coupled to circuit ground by a pulldown resistor 364, the emitter of transistor 362 is coupled to line 356 by a degeneration resistor 366 and the collectors of both transistors are connected to a line 368. Line 356 is coupled to circuit ground by a biasing resistor 370. Line 368 is coupled to power supply line 214 by a decoupling resistor 372 and to circuit ground by a decoupling capacitor 374.

Crystal oscillator 46 also includes an emitter follower buffer amplifier employing an NPN transistor 376. Transistor 376 has a base coupled to line 352 by an oscillation suppression resistor 378, a collector connected to line 368 and an emitter coupled to circuit ground by an emitter resistor 380 and to line 62 by a DC blocking capacitor 382. Bias for transistor 376, as well as transistor 360, is provided by a first biasing resistor 384 connected between line 368 and line 352 and a second biasing resistor 386 connected between line 352 and circuit ground.

Mixer 48 includes a doubly balanced multiplying device 400 such as that which is designated 1496 by Motorola Inc. The device 400 has two input ports, one being connected between a line 402 and line 62 and the other being connected between line 60 and a line 404. These ports 406 connected between line 214 and line 402, a biasing resistor 408 connected between line 402 and a line 410 and a biasing resistor 412 connected between line 410 and circuit ground. A resistor 414 connected between line 402 and line 62, a resistor 416 connected between line 60 and line 410 and a resistor 418 connected between line 410 and line 404, in addition to biasing device 400, establishes the input impedance therefor. A decoupling capacitor 420 connected between line 402 and circuit ground and a decoupling capacitor 422 connected between line 410 and circuit ground bypass AC signals on these lines.

Connected between line 402 and an input of device 400, a resistor 424 establishes the bias current for the device. The device is balanced to minimize the level of the carrier in the output by a network which includes a potentiometer 426 having a grounded wiper and a pair of resistors 428 and 430 connected from distal ends of potentiometer 426 to lines 404 and 60, respectively. A potentiometer 432 connected between a pair of terminals of device 400 controls the gain thereof. One terminal of the output port of device 400 is connected to line 64, and the other is connected to a power supply line 434 which is coupled to circuit ground by a decoupling capacitor 436 and to power supply 114 by a decoupling capacitor 438.

Filter 50 includes a filter network and a buffer amplifier. The filter network includes a resonating capacitor 450 connected between line 64 and circuit ground and a variable inductor 452 connected between line 64 and line 434. The emitter follower includes an NPN transistor 460 having a base coupled by an oscillation suppression resistor 462 to a biasing network that is coupled by a DC blocking capacitor 464 to line 64, an emitter connected to line 56 which is coupled to circuit ground by an emitter resistor 466 and a collector which is connected to line 368. The biasing network includes a pair of resistors 468 and 470, series connected between line 368 and circuit ground.

It is contemplated that after having read the preceding disclosure, certain alterations and modifications of the present invention will no doubt become apparent to those skilled in the art. It is therefore intended that the following claims be interpreted to cover all alterations and modifications as fall within the true spirit and scope of the invention.

What is claimed is:

1. A phase-locked loop for generating at an output terminal an output signal which tracks in phase and frequency a coherent component of a gated input signal derived from a video tape recorder, the loop comprising in combination:
    a phase detector connected to the output terminal for comparing the phase of the output signal with that of the input signal to develop an error signal;
    a voltage-controlled oscillator having stability of a first stability value and driven by the error signal for generating a correcting signal;
    oscillator means for generating a reference signal having a stability of a second stability value which is higher than said first stability value and having a frequency greater than that of said correcting signal;
    a mixer for combining said correcting signal with said reference signal to generate an output signal having a stability of a third stability value which is greater than said first stability value; and
    means for coupling said output signal to said output terminal.

2. A phase locked loop as recited in claim 1 wherein said mixer further generates an image signal and wherein said coupling means is a filter for attenuating the level of said image signal.

3. A phase locked loop as recited in claim 1 wherein said oscillator means is a crystal controlled oscillator.

4. A phase-locked loop for generating at an output terminal an output signal which tracks in phase and frequency a coherent component of a gated input signal derived from a signal source in which the frequency stability has been degraded, the loop comprising in combination:
    a phase detector connected to the output terminal for comparing the phase of the output signal with that of the input signal to develop an error signal;
    a voltage-controlled oscillator having a stability of a first stability value and driven by the error signal for generating a correcting signal;
    oscillator means for generating a reference signal having a stability of a second stability value which is higher than said first stability value and having a frequency greater than that of said correcting signal;
    a mixer for combining said correcting signal with said reference signal to generate an output signal having a stability of a third stability value which is greater than said first stability value; and
    means for coupling said output signal to said output terminal.

5. A chrominance subcarrier regeneration network for generating at an output terminal a regenerated signal which tracks in frequency and phase a subcarrier burst signal reproduced from a video tape, the network comprising in combination:
    a phase detector connected to the output terminal for comparing the phase of the regenerated signal with that of the subcarrier burst signal reproduced from a video tape to develop an error signal;
    a voltage-controlled oscillator having a stability of a first stability value and driven by the error signal for generating a correcting signal;
    a crystal oscillator for generating a reference signal having a stability of a second stability value which is greater than said first stability value;
    a mixer for combining said correcting signal with said reference signal to generate said regenerated signal having a stability of a third stability value which is greater than said first stability value; and
    means for coupling said regenerated signal to said output terminal.

6. A chrominance subcarrier regeneration network as recited in claim 5 wherein said mixer means further generates an image signal and wherein said coupling means includes a filter for attenuating the level of said image signal.

7. A chrominance subcarrier regeneration network as recited in claim 5 wherein the frequency of said regenerated signal is at least three times greater than the frequency of said correcting signal.

* * * * *

UNITED STATES PATENT OFFICE
CERTIFICATE OF CORRECTION

Patent No. 4,366,451   Dated  December 28, 1982

Inventor(s) Leonard Kowal

It is certified that error appears in the above-identified patent and that said Letters Patent are hereby corrected as shown below:

Column 1, line 24, delete "180°" and substitute therefor --90°--;

line 25, delete "180°" and substitute therefor --90°--;

Column 3, line 29, delete "twice" and substitute therefor --time--.

Signed and Sealed this

Twenty-seventh Day of September 1983

[SEAL]

Attest:

Attesting Officer

GERALD J. MOSSINGHOFF

Commissioner of Patents and Trademarks